(12) United States Patent
Replogle et al.

(10) Patent No.: US 6,225,027 B1
(45) Date of Patent: May 1, 2001

(54) EXTREME-UV LITHOGRAPHY SYSTEM

(75) Inventors: William C. Replogle, Livermore, CA (US); William C. Sweatt, Albuquerque, NM (US)

(73) Assignee: EUV LLC, Livermore, CA (US)

( * ) Notice: Subject to any disclaimer, the term of this patent is extended or adjusted under 35 U.S.C. 154(b) by 0 days.

(21) Appl. No.: 09/305,172

(22) Filed: May 4, 1999

Related U.S. Application Data

(63) Continuation-in-part of application No. 09/130,224, filed on Aug. 6, 1998, now Pat. No. 6,118,577, and a continuation-in-part of application No. 09/249,738, filed on Feb. 11, 1999.

(51) Int. Cl.[7] .............................. G03C 5/00; G02B 5/08; G02B 5/10; G02B 5/18; G21K 5/00
(52) U.S. Cl. ..................... 430/311; 430/966; 359/351; 359/570; 359/572; 359/851; 359/856; 359/857; 359/858; 378/35
(58) Field of Search .................................. 430/311, 966; 378/34, 35, 85, 87, 145; 359/351, 570, 572, 851, 856, 857, 858

(56) References Cited

U.S. PATENT DOCUMENTS

| | | | |
|---|---|---|---|
| 5,315,629 | * 5/1994 | Jewell et al. | 378/34 |
| 5,339,346 | * 8/1994 | White | 378/34 |
| 5,361,292 | 11/1994 | Sweatt | 378/34 |
| 5,439,781 | 8/1995 | MacDowell et al. | 378/34 |
| 5,512,759 | 4/1996 | Sweatt | 378/34 |
| 5,805,365 | * 9/1998 | Sweatt | 359/858 |
| 6,033,079 | * 3/2000 | Hudyma | 359/857 |
| 6,118,577 | * 9/2000 | Sweatt et al. | 359/351 |

OTHER PUBLICATIONS

Sweeney et al., "EUV Optical Design for a 100 nm CD Imaging System", SPIE, vol. 3331, pp. 2–10, 1998.

* cited by examiner

*Primary Examiner*—Shean C. Wu
(74) *Attorney, Agent, or Firm*—Burns, Doane, Swecker & Mathis, L.L.P.

(57) ABSTRACT

A photolithography system that employs a condenser that includes a series of aspheric mirrors on one side of a small, incoherent source of radiation producing a series of beams is provided. Each aspheric mirror images the quasi point source into a curved line segment. A relatively small arc of the ring image is needed by the camera; all of the beams are so manipulated that they all fall onto this same arc needed by the camera. Also, all of the beams are aimed through the camera's virtual entrance pupil. The condenser includes a correcting mirror for reshaping a beam segment which improves the overall system efficiency. The condenser efficiently fills the larger radius ringfield created by today's advanced camera designs. The system further includes (i) means for adjusting the intensity profile at the camera's entrance pupil or (ii) means for partially shielding the illumination imaging onto the mask or wafer. The adjusting means can, for example, change at least one of: (i) partial coherence of the photolithography system, (ii) mask image illumination uniformity on the wafer or (iii) centroid position of the illumination flux in the entrance pupil. A particularly preferred adjusting means includes at least one vignetting mask that covers at least a portion of the at least two substantially equal radial segments of the parent aspheric mirror.

32 Claims, 13 Drawing Sheets

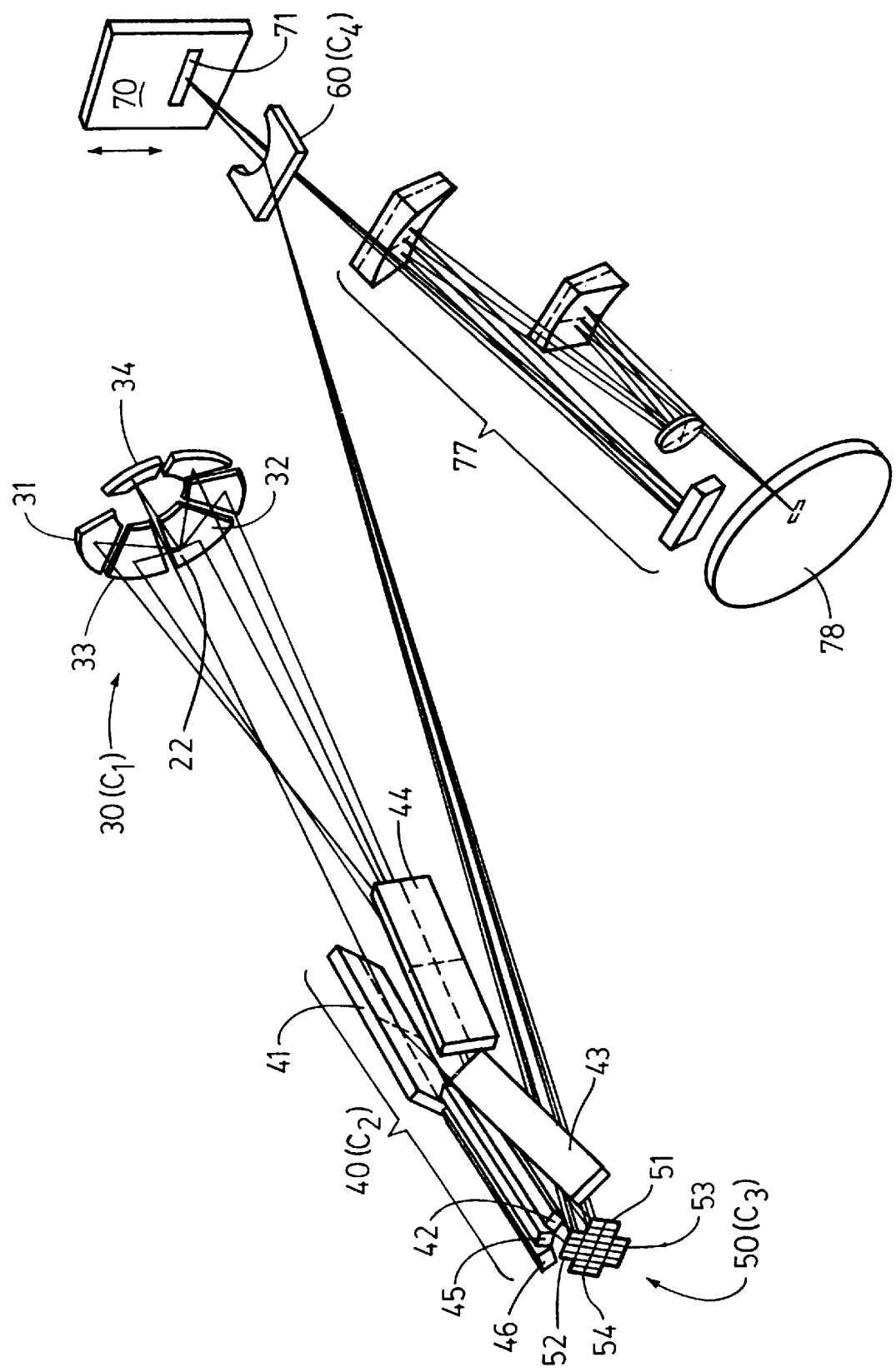
FIG._1A.

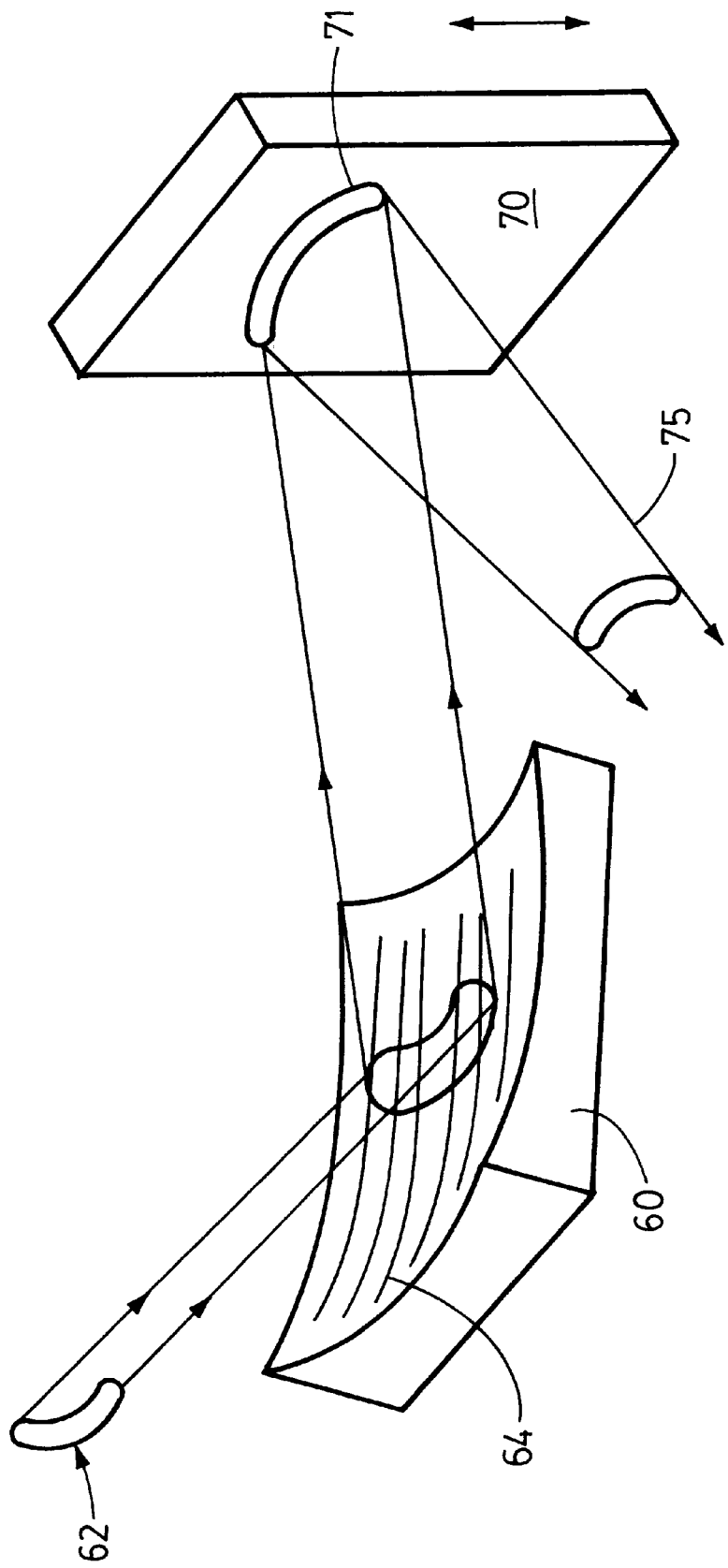
FIG._1B.

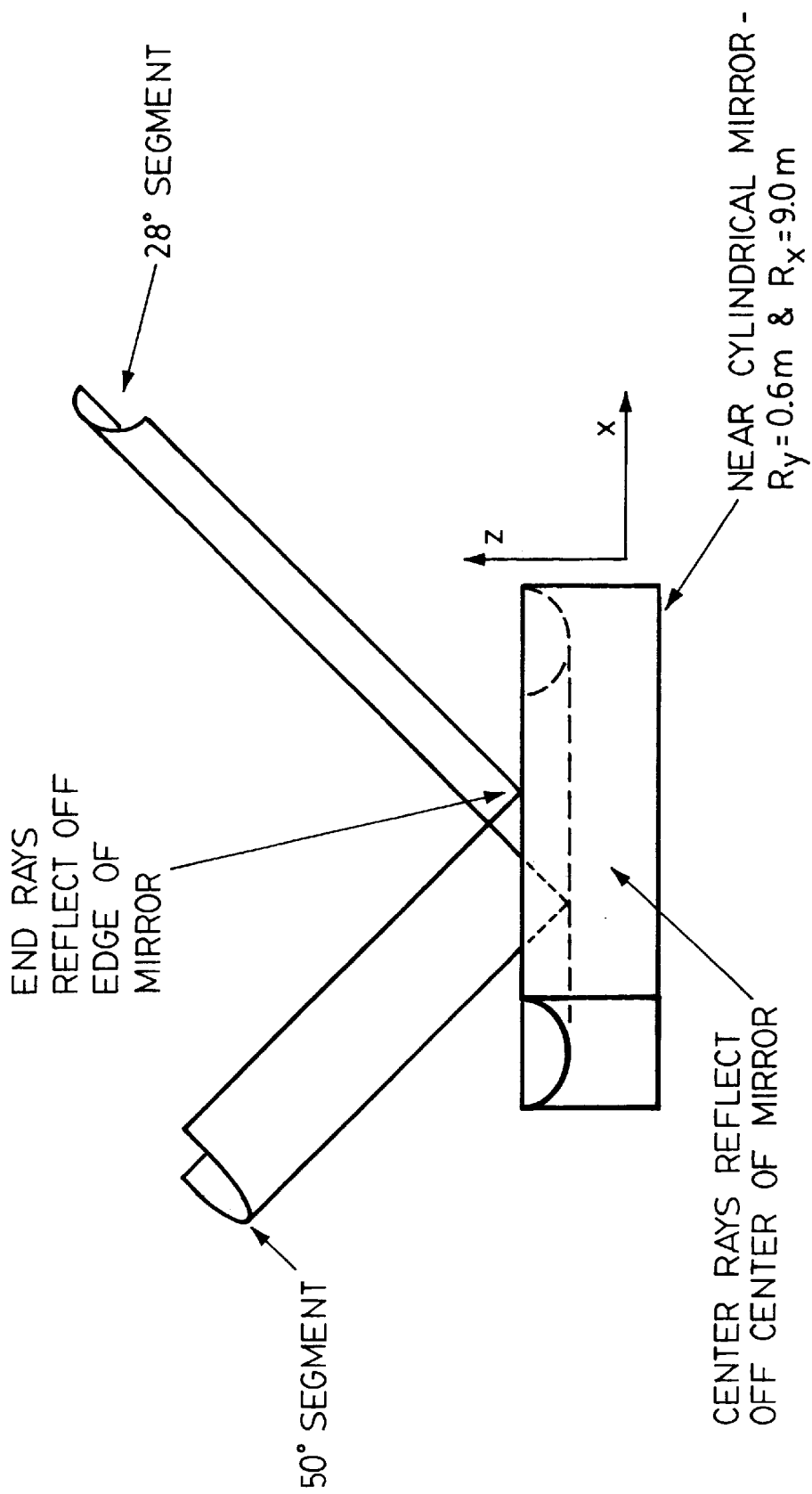
FIG._1C.

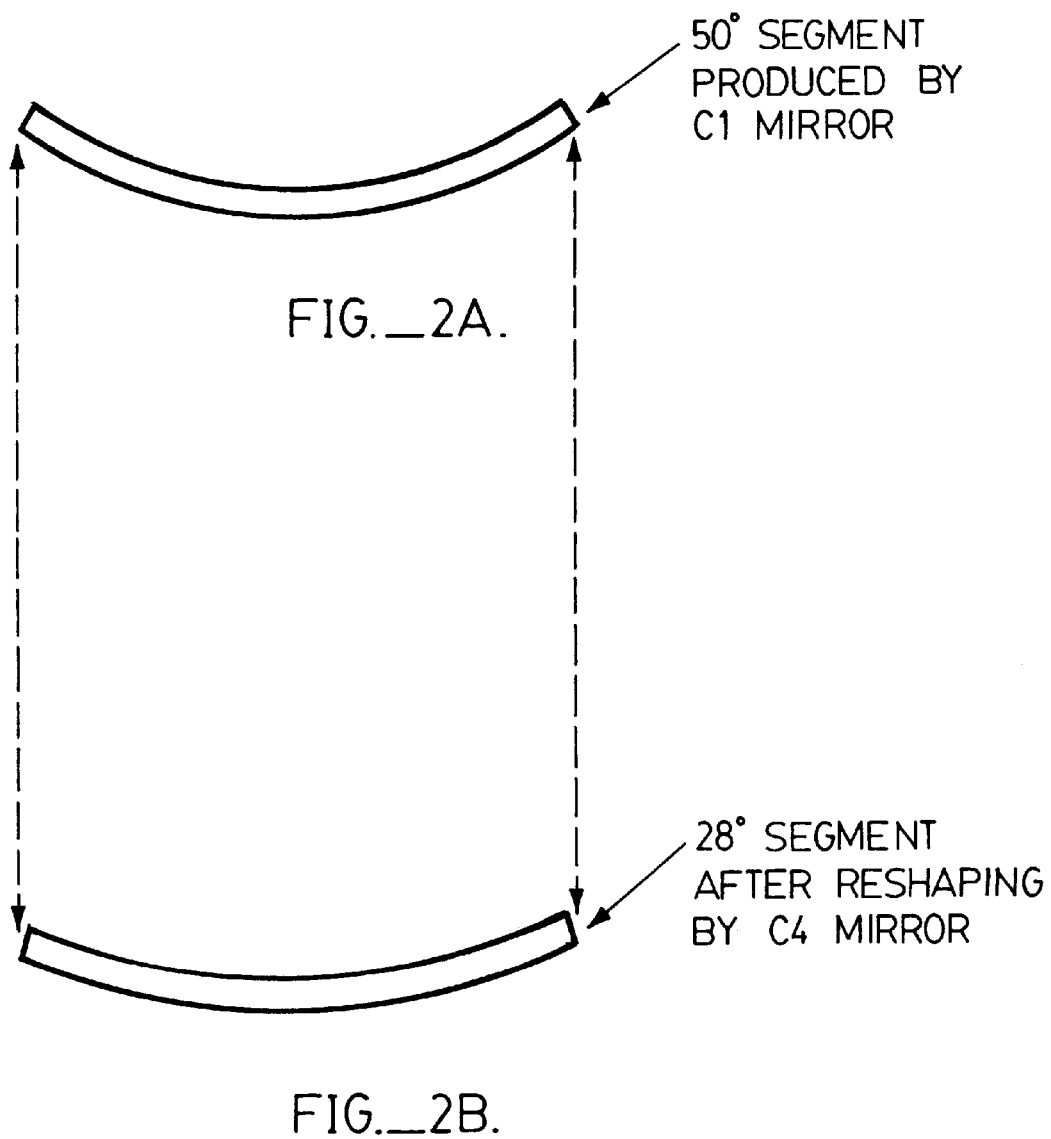

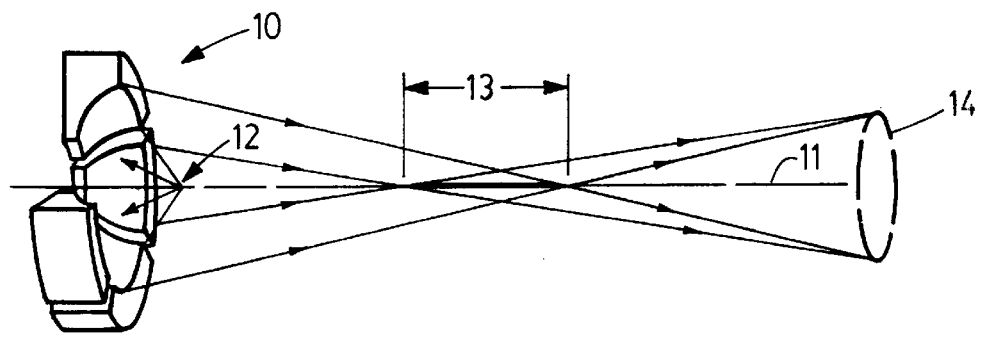
FIG._3.
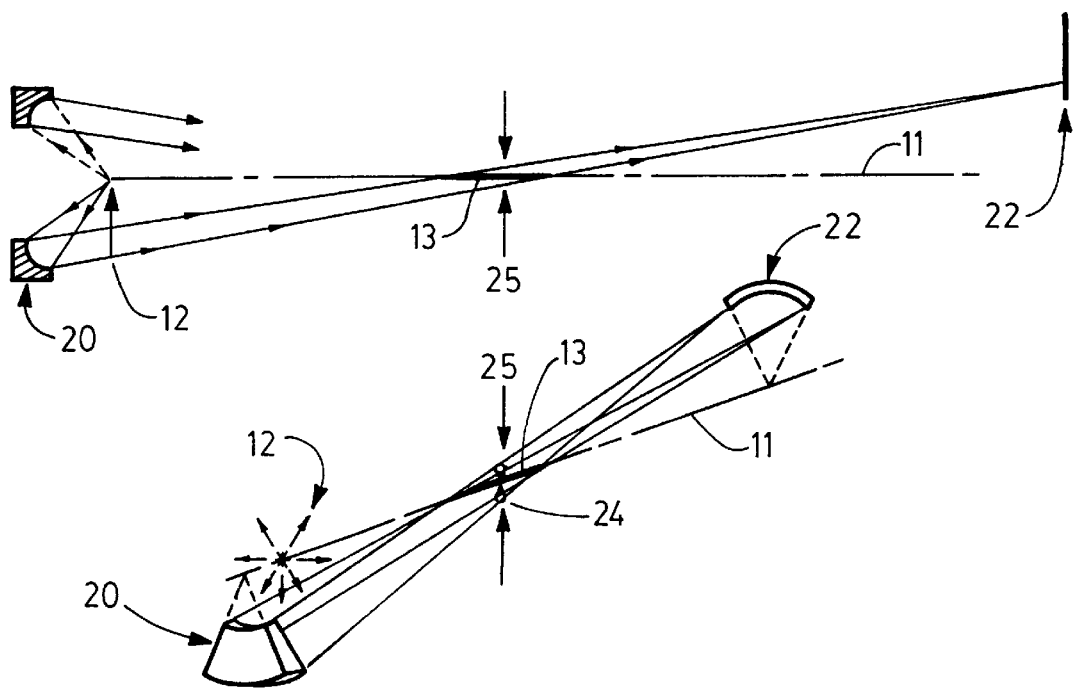
FIG._4.

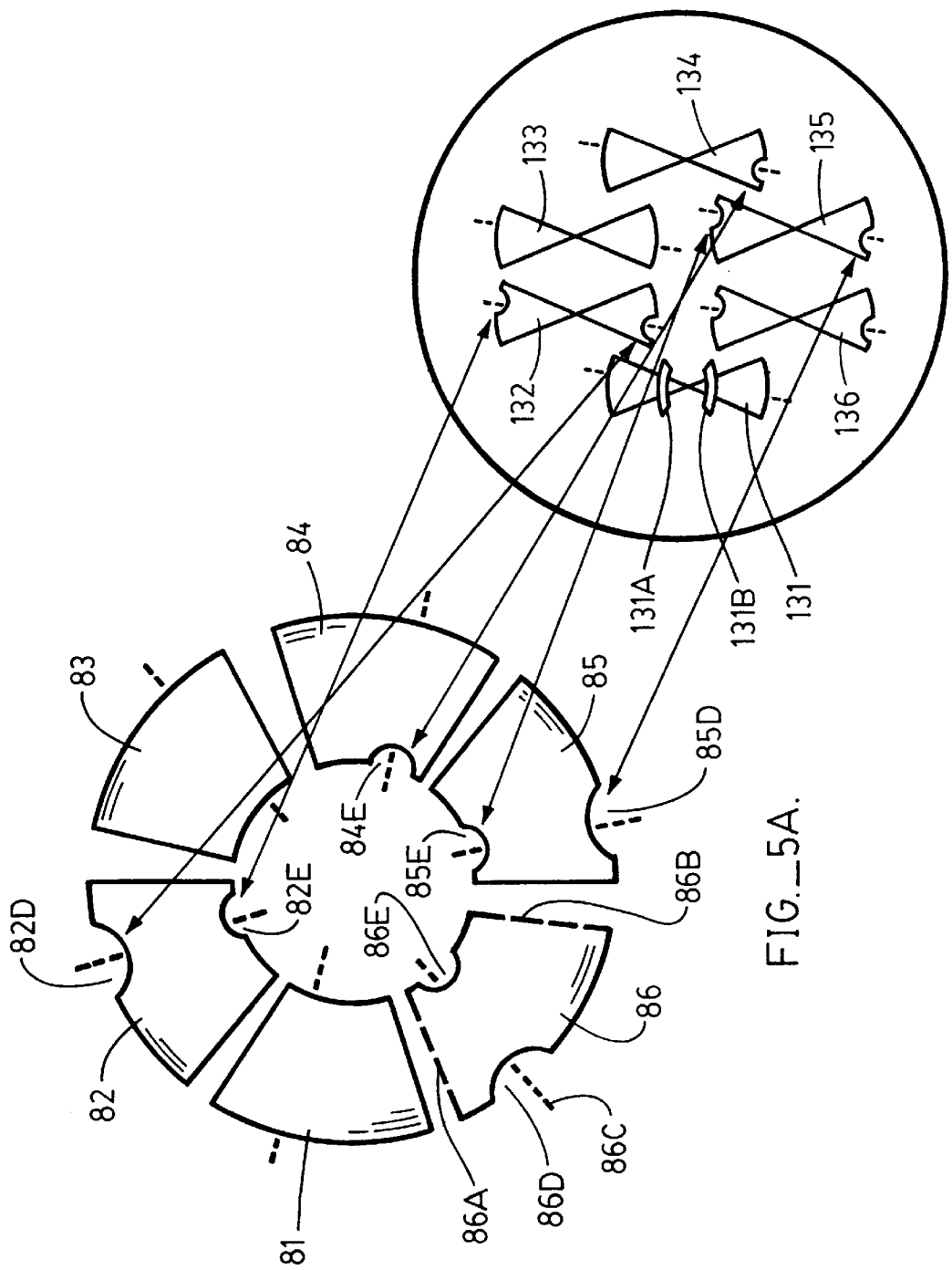
FIG._5A.
FIG._5B.

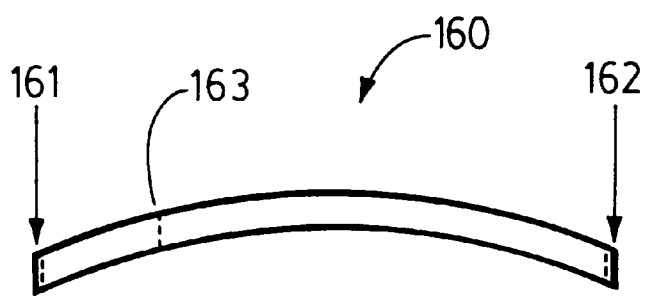
FIG._5C.
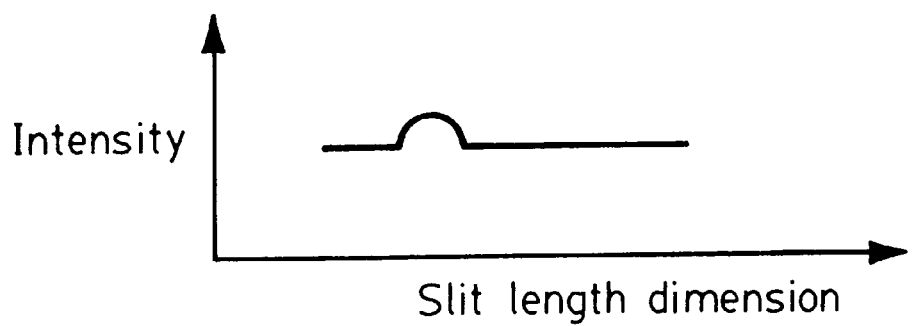
FIG._6.

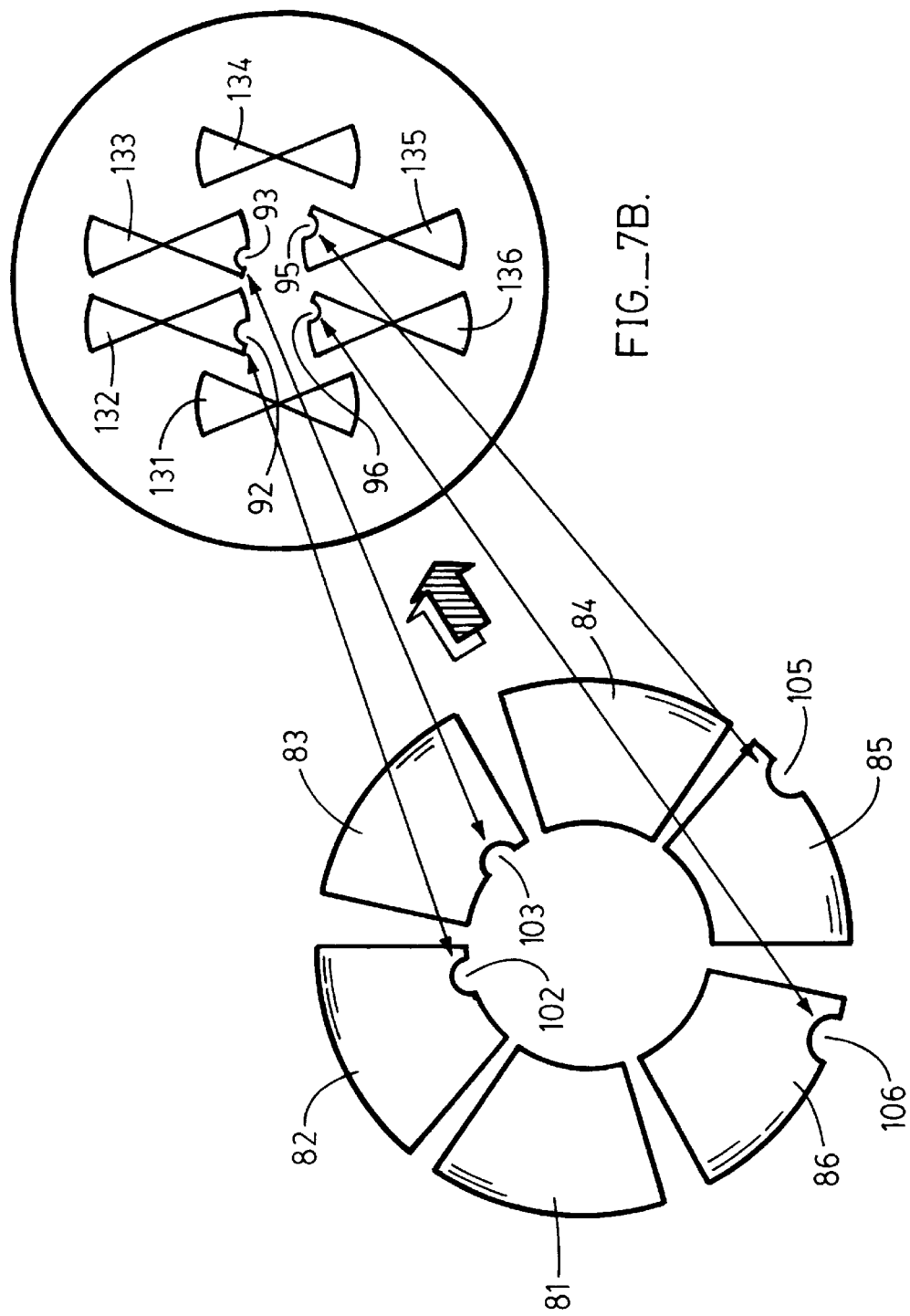
FIG._7B.
FIG._7A.

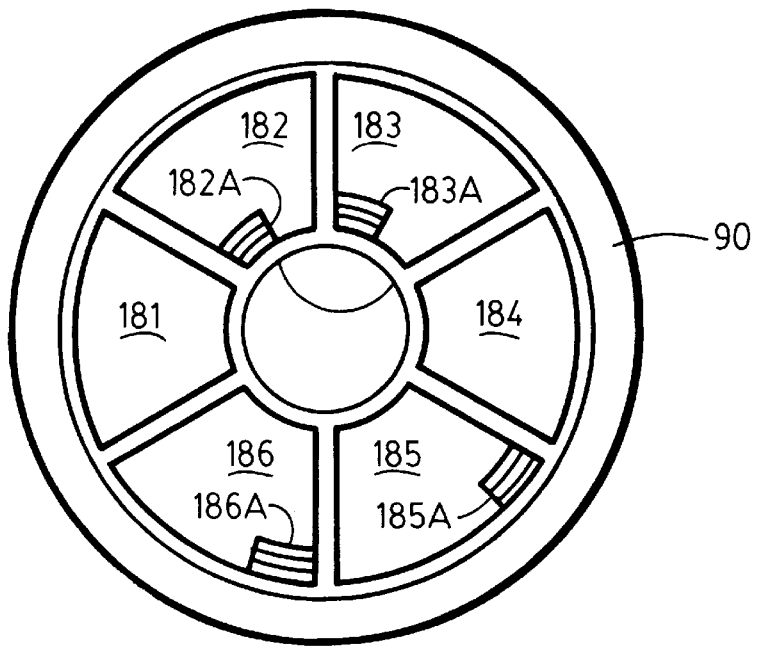
FIG._8.
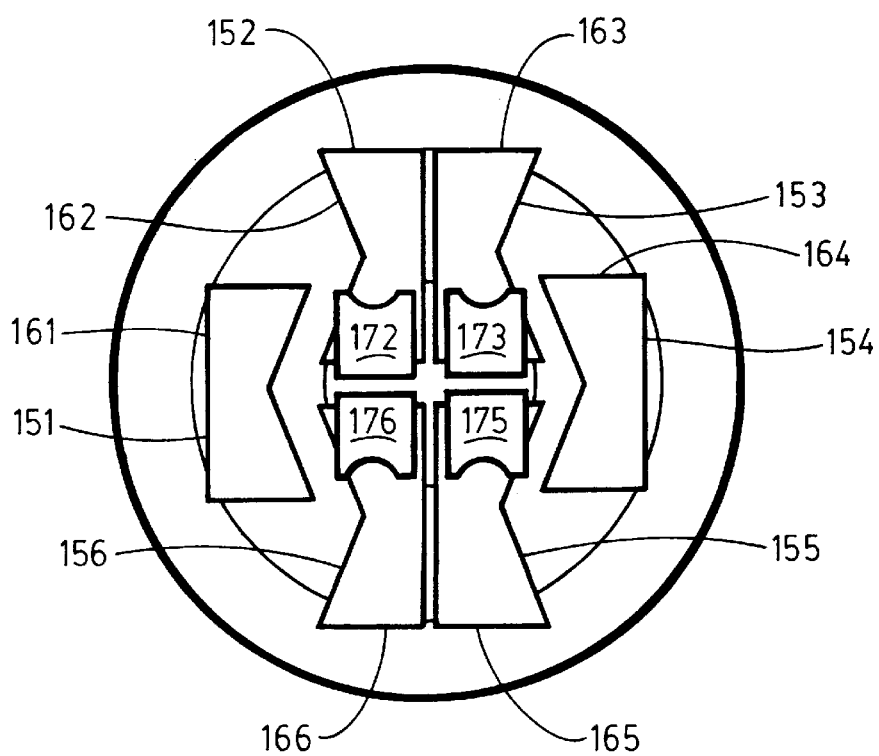
FIG._9.

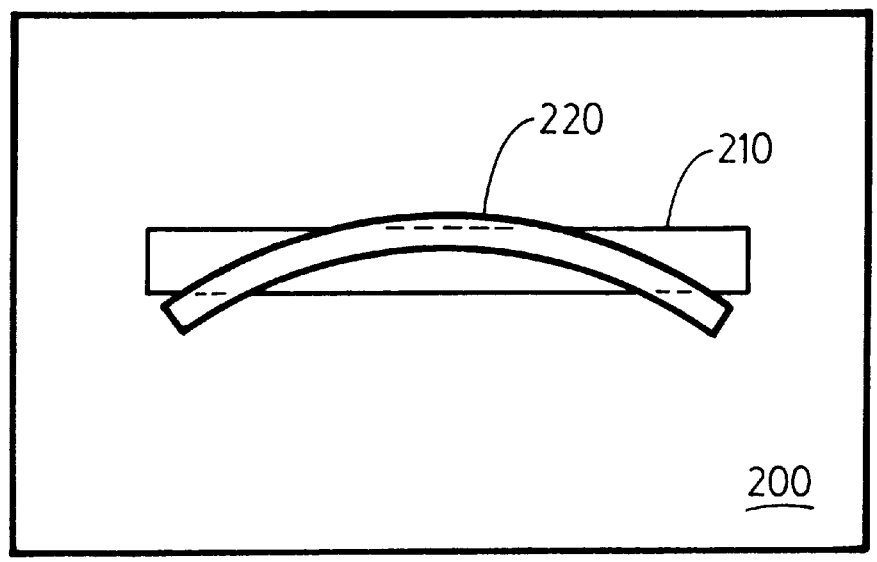
FIG._10.
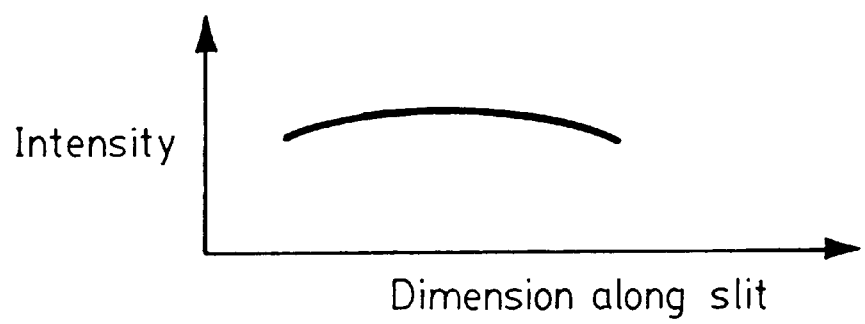
FIG._11.

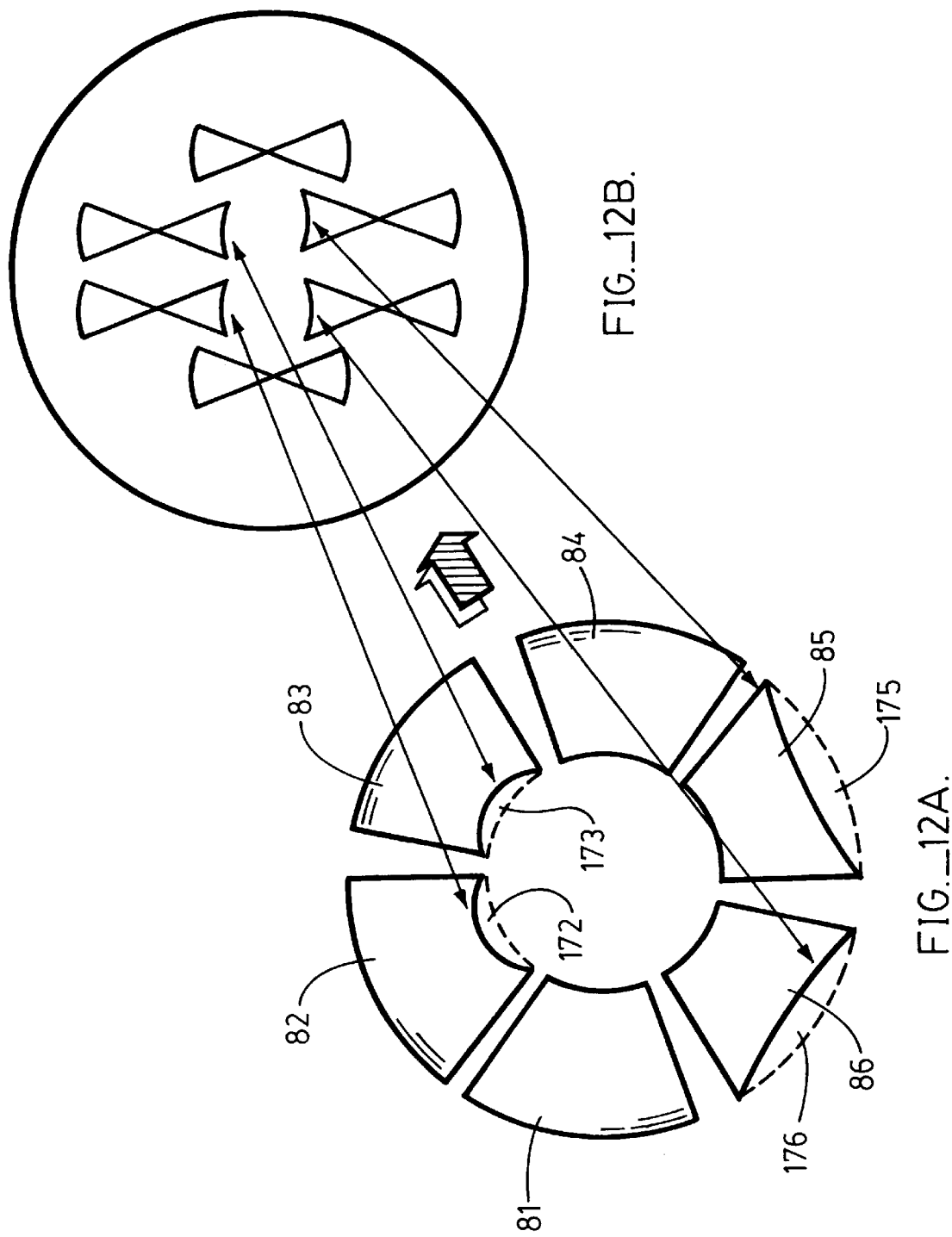
FIG._12B.
FIG._12A.

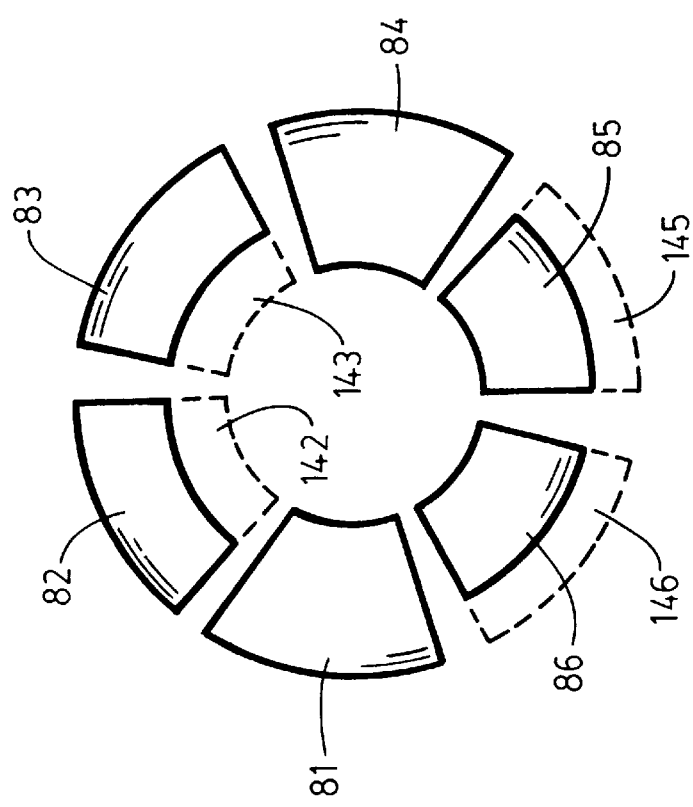
FIG._13B.
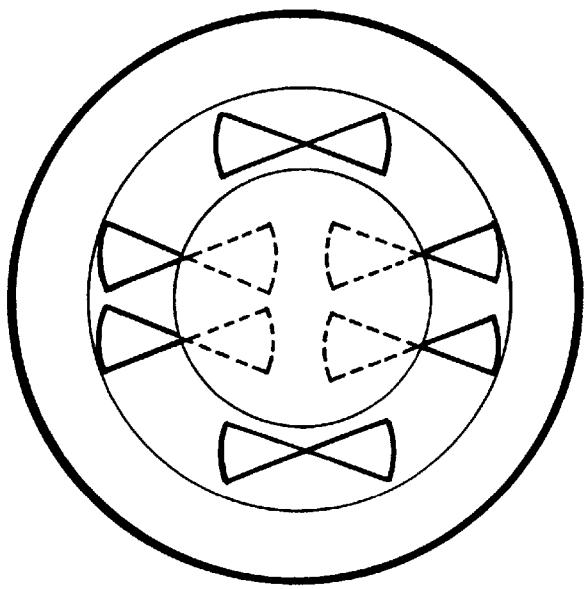
FIG._13A.

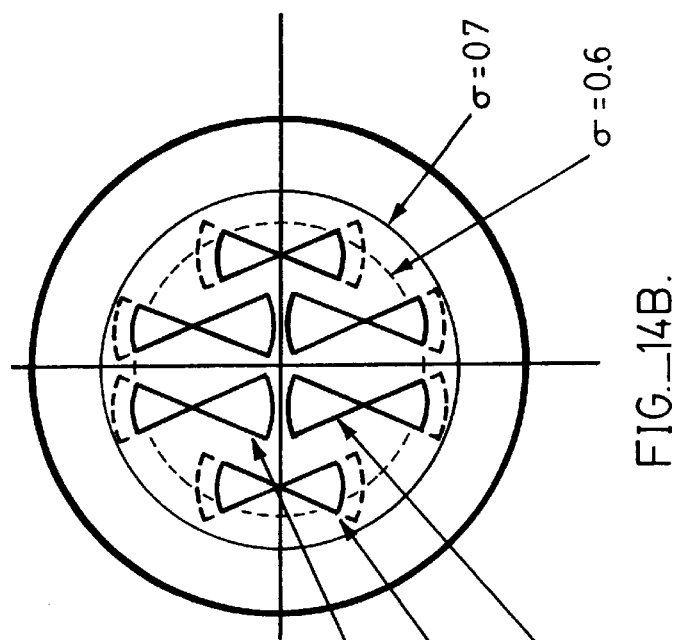
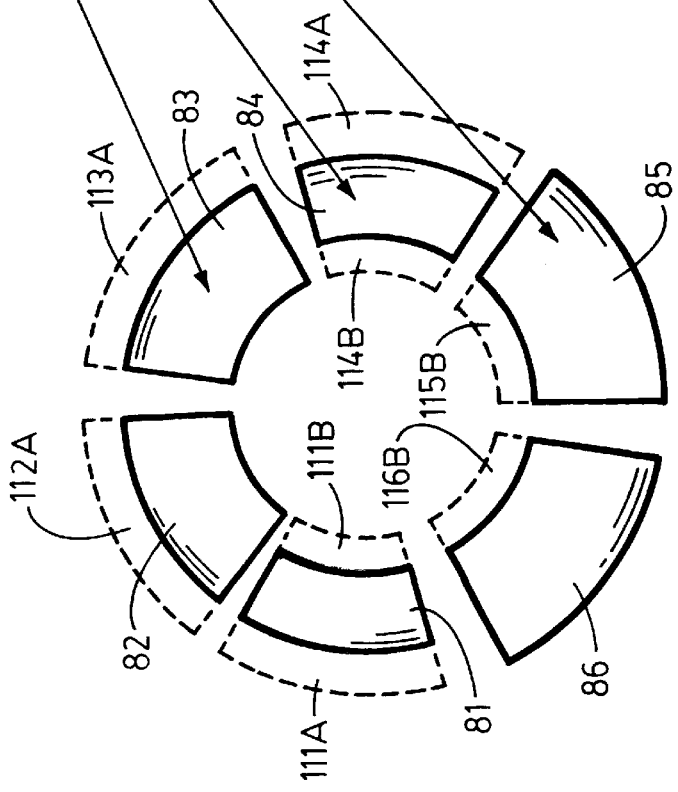
FIG._14B.
FIG._14A.

EXTREME-UV LITHOGRAPHY SYSTEM

REFERENCE TO RELATED APPLICATION

This is a continuation-in-part application of Ser. No. 09/130,224 filed on Aug. 6, 1998, now U.S. Pat. No. 6,118,577, and Ser. No. 09/249,738 filed on Feb. 11, 1999.

This invention was made with Government support under Contract No. DE-AC04-94AL85000 awarded by the U.S. Department of Energy to Sandia Corporation. The Government has certain rights to the invention.

FIELD OF THE INVENTION

This invention relates to condensers that collect radiation and deliver it to a ringfield camera. More particularly, this condenser collects radiation, here soft x-rays, from either a small, incoherent source and couples it to the ringfield of a camera designed for projection lithography.

BACKGROUND OF THE INVENTION

In general, lithography refers to processes for pattern transfer between various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing. As feature sizes are driven smaller and smaller, optical systems are approaching their limits caused by the wavelengths of the optical radiation. "Long" or "soft" x-rays (a.k.a. Extreme UV) (wavelength range of $\lambda=100$ to 200 Å ("Angstrom")) are now at the forefront of research in efforts to achieve the smaller desired feature sizes. Soft x-ray radiation, however, has its own problems. The complicated and precise optical lens systems used in conventional projection lithography do not work well for a variety of reasons. Chief among them is the fact that there are no transparent, non-absorbing lens materials for soft x-rays and most x-ray reflectors have efficiencies of only about 70%, which in itself dictates very simple beam guiding optics with very few surfaces.

One approach has been to develop cameras that use only a few surfaces and can image with acuity (i.e., sharpness of sense perception) only along a narrow arc or ringfield. Such cameras then scan a reflective mask across the ringfield and translate the image onto a scanned wafer for processing. Although cameras have been designed for ringfield scanning (e.g., Jewell et al., U.S. Pat. No. 5,315,629 and Offner, U.S. Pat. No. 3,748,015), available condensers that can efficiently couple the light from a synchrotron source to the ringfield required by this type of camera have not been fully explored. Furthermore, full field imaging, as opposed to ringfield imaging, requires severely aspheric mirrors in the camera. Such mirrors cannot be manufactured to the necessary tolerances with present technology for use at the required wavelengths.

The present state-of-the-art for Very Large Scale Integration ("VLSI") involves chips with circuitry built to design rules of 0.25 µm. Effort directed to further miniaturization takes the initial form of more fully utilizing the resolution capability of presently-used ultraviolet ("UV") delineating radiation. "Deep UV" (wavelength range of $\lambda=0.3$ µm to 0.1 µm), with techniques such as phase masking, off-axis illumination, and step-and-repeat may permit design rules (minimum feature or space dimension) of 0.18 µm or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths.

Various x-ray radiation sources are under consideration. One source, the electron storage ring synchrotron, has been used for many years and is at an advanced stage of development. Synchrotrons are particularly promising sources of x-rays for lithography because they provide very stable and defined sources of x-rays, however, synchrotrons are massive and expensive to construct. They are cost effective only serving several steppers.

Another source is the plasma x-ray source, which depends upon a high power, pulsed laser (e.g., a yttrium aluminum garnet ("YAG") laser), or an excimer laser, delivering 500 to 1,000 watts of power to a 50 µm to 250 µm spot, thereby heating a source material to, for example, 250,000 ° C., to emit x-ray radiation from the resulting plasma. Plasma sources are compact, and may be dedicated to a single production line (so that malfunction does not close down the entire plant). A stepper employing a laser plasma source is relatively inexpensive and could be housed in existing facilities. It is expected that x-ray sources suitable for photolithography that provide bright, incoherent x-rays and that employ physics quite different from that of the laser plasma source will be developed.

A variety of x-ray patterning approaches are under study. Probably the most developed form of x-ray lithography is proximity printing. In proximity printing, object:image size ratio is necessarily limited to a 1:1 ratio and is produced much in the manner of photographic contact printing. A fine-membrane mask is maintained at one or a few microns spacing from the wafer (i.e., out of contact with the wafer, thus, the term "proximity"), which lessens the likelihood of mask damage but does not eliminate it. Making perfect masks on a fragile membrane continues to be a major problem. Necessary absence of optics in-between the mask and the wafer necessitates a high level of parallelism (or collimation) in the incident radiation. X-ray radiation of wavelength $\lambda \leq 16$ Å is required for 0.25 µm or smaller patterning to limit diffraction at feature edges on the mask.

Use has been made of the synchrotron source in proximity printing. Consistent with traditional, highly demanding, scientific usage, proximity printing has been based on the usual small collection arc. Relatively small power resulting from the 10 mrad to 20 mrad arc of collection, together with the high-aspect ratio of the synchrotron emission light, has led to use of a scanning high-aspect ratio illumination field (rather than the use of a full-field imaging field).

Projection lithography has natural advantages over proximity printing. One advantage is that the likelihood of mask damage is reduced because the mask does not have to be positioned within microns of the wafer as is the case for proximity printing. The cost of mask fabrication is considerably less because the features are larger. Imaging or camera optics in-between the mask and the wafer compensate for edge scattering and, so, permit use of longer wavelength radiation. Use of extreme ultra-violet radiation (a.k.a., soft x-rays) in bands at which multilayer coatings have been developed (i.e., λ=13.4 nm, λ=11.4 nm) allows the use of near-normal reflective optics. This in turn has lead to the development of lithography camera designs that are nearly diffraction limited over useable image fields. The resulting system is known as extreme UV("EUVL") lithography (a.k.a., soft x-ray projection lithography ("SXPL")).

A favored form of EUVL projection optics is the ringfield camera. All ringfield optical forms are based on radial dependence of aberration and use the technique of balancing low order aberrations, i.e., third order aberrations, with higher order aberrations to create long, narrow arcuate fields of aberration correction located at a fixed radius as measured from the optical axis of the system (regions of constant radius, rotationally symmetric with respect to the axis). Consequently, the shape of the corrected region is an arcuate or curved strip rather than a straight strip. The arcuate strip is a segment of the circular ring with its center of revolution at the optic axis of the camera. See FIG. 4 of U.S. Pat. No. 5,315,629 for an exemplary schematic representation of an arcuate slit defined by width, W, and length, L, and depicted as a portion of a ringfield defined by radial dimension, R, spanning the distance from an optic axis and the center of the arcuate slit. The strip width defines a region in which features to be printed are sharply imaged. Outside this region, increasing residual astigmatism, distortion, and Petzval curvature at radii greater or smaller than the design radius reduce the image quality to an unacceptable level. Use of such an arcuate field allows minimization of radially-dependent image aberrations in the image and use of object:image size reduction of, for example, 4:1 reduction, results in significant cost reduction of the, now, enlarged-feature mask.

Sweatt, U.S. Pat. No. 5,361,292, discloses a condenser that includes a series of aspheric mirrors on one side of a small, incoherent source of radiation. If the mirrors were continuously joined into a parent mirror, they would image the quasi point source into a ring image with a diameter of a few tens of centimeters at some distance, here some number of meters. Since only a relatively small arc (about 60 degrees) of the ring image is needed by the camera, the most efficient solution is to have about five 60 degrees beams, all of which are manipulated such that they all fall onto the same arc needed by the camera. Also, all of the beams must be aimed through the camera's virtual entrance pupil. These requirements are met in two steps.

First, the beams are individually rotated and translated, as necessary, using mirrors so that they overlap at the ringfield and pass through the real entrance pupil. The second step is to image this real entrance pupil into the camera's virtual entrance pupil using a powered imaging mirror. This places the corrected, combined images of the mirrors into the proper position for use by the camera. This system may be configured in a variety of ways.

The earliest ringfield EUVL cameras as exemplified by Jewell et al., U.S. Pat. No. 5,315,629, that are designed for printing large (25 mm×25 mm) chips had instantaneous fields of view with an average radius of 25 mm and a chord length of 25 mm. When this type of ringfield camera is employed with the condenser of U. S. Pat. No. 5,361,292 the angle of the chord is 60 degrees which fit the 5 off-axis segments of the aspheric mirror, each 60 degrees wide, that comprise the illuminator or collecting mirrors of the condenser. However, with improved camera designs that have roughly the same chord length but with a much larger, e.g., 52 mm, average radius of the ringfield, the angle of the chord is about 28 degrees, into which the six ring images created by the illuminator mirrors are fitted. Six times the 28 degrees is significantly less half of the 360 degrees available so that a condenser using the design presented in U.S. Pat. No. 5,361,292 would be fairly inefficient.

One of the major causes of nonuniformity of line width in wafers is nonuniformity of illumination at either the reticle or wafer. A related factor which influences the critical dimensions is the partial coherence illumination properties along the ring field; the partial coherence being the fraction of the pupil filled with radiation from the condenser. Thus, despite the advantages in condenser designs for projection photolithography, the art is in search of techniques for enhancing image quality by improving illumination uniformity and/or controlling the partial coherence.

SUMMARY OF THE INVENTION

The present invention is directed to improvements to a photolithography system that employs a condenser that includes a series of aspheric mirrors on one side of a small, incoherent source of radiation producing a series of beams. Each aspheric mirror images the quasi point source into a curved line segment. A relatively small arc of the ring image is needed by the camera; all of the beams are so manipulated that they all fall onto this same arc needed by the camera. Also, all of the beams are aimed through the camera's virtual entrance pupil. The condenser includes a correcting mirror for reshaping a beam segment which improves the overall system efficiency. The condenser efficiently fills the larger radius ringfield created by today's advanced camera designs.

Because of misalignment of the channels of the condensers and fabrication errors or blemishes on the mirrors, the illumination at the reticle and wafer may be non-uniform. Specifically, the illumination along the length of the arc on the reticle may be non-uniform. A typical phenomenon is that the illumination is strongest at the middle of the arc.

The present invention is directed in part to techniques for adjusting the intensity profile at the camera's entrance pupil. The invention can be employed to improve the illumination uniformity of the image at the reticle (i.e., mask) and/or wafer. The inventive technique can also be employed to adjust the partial coherence of the photolithography system by changing the illumination profile of the entrance pupil fill.

Accordingly, in one embodiment, the invention is directed to a photolithography system for projecting a mask image onto a wafer that includes:
    a ringfield camera;
    a small compact source of radiation;
    a condenser that comprises:
        (i) collector mirrors comprising at least two substantially equal radial segments of a parent aspheric mirror, each having one focus at the radiation source and a curved line focus filling the object field of the camera at the radius of the ringfield and each producing a beam of radiation; and
        (ii) corresponding number of sets of correcting mirror means which are capable of translation or rotation, or both, such that all of the beams of radiation pass through the entrance pupil of the ringfield camera and form a coincident arc image at the ringfield radius, wherein at least one of the correcting mirrors of each set, or a mirror that is common to said sets of mirrors, from which the radiation emanates, is a concave relay mirror that is positioned to shape a beam segment having a chord angle of about 25 to 85 degrees into a second beam segment having a chord angle of about 0 to 60 degrees;

a mask that is positioned at the ringfield camera's object plane and from which the mask image in the form of an intensity profile is reflected into the entrance pupil of the ringfield camera;

a wafer onto which the mask image is projected from the ringfield camera; and means for (i) adjusting the intensity profile at the camera's entrance pupil or (ii) partially shielding the illumination imaging onto the mask or wafer.

In a preferred embodiment of the photolithography system, the adjusting means changes at least one of: (i) partial coherence of the photolithography system, (ii) mask image illumination uniformity on the wafer or (iii) the position of the centroid of the illumination flux (i.e., optical power) in the camera's entrance pupil.

In another preferred embodiment of the photolithography system, the adjusting means includes at least one vignetting mask that covers at least a portion of the at least two substantially equal radial segments of the parent aspheric mirror.

In yet another embodiment of the photolithography system, the adjusting means changes the partial coherence by reducing the area of the entrance pupil that is filled by the image.

BRIEF DESCRIPTION OF THE DRAWINGS

FIG. 1A is a perspective view of an EUV photolithography system showing the beams going through its set of correcting mirrors and showing the interaction of the beam with the camera;

FIGS. 1B and 1C illustrate a steeply tilted biconvex mirror;

FIGS. 2A and 2B illustrate a beam segment before and after reshaping;

FIG. 3 is a side-view of the condenser system without correcting mirrors, showing the reimaging of the point source into a ringfield with the images crossing over the center line of the system;

FIG. 4 is another side-view showing the geometries of the mirrors and the beams in more detail for this embodiment;

FIG. 5A illustrates the six mirror segments of the collector mirror with arbitrary trimming;

FIG. 5B illustrates the intensity profile at the camera pupil formed by the radiation from the six mirror segments of FIG. 5A;

FIG. 5C illustrates the slit at the reticle or mask;

FIG. 6 is a graph of one possible intensity profile of the arc-shaped illumination on a mask vs. distance along the illumination;

FIG. 7A illustrates the six mirror segments of the collector mirror with four trimmed segments;

FIG. 7B illustrates the intensity profile at the camera pupil formed by the radiation from the six mirror segments of FIG. 7A;

FIG. 8 illustrates the six mirror segments of the collector mirror that are partially covered with vignetting masks to produce annular illumination;

FIG. 9 illustrates six bow tie images that are focused on segments of a reflecting mirror and associated vignetting masks;

FIG. 10 illustrates a shield with an at least partially EUV radiation transmitting window that can be positioned adjacent to the mask or wafer;

FIG. 11 is a graph of intensity of the arc-shaped illumination on a mask vs. distance along the illumination;

FIG. 12A illustrates the six mirror segments of the collector mirror with four segments that are partially covered with vignetting masks FIG. 12B illustrates the intensity profile at the camera pupil formed by the radiation from the six mirror segments of FIG. 12A;

FIG. 13A illustrates the six mirror segments of the collector mirror with four segments that are partially covered with vignetting masks;

FIG. 13B illustrates the annular intensity profile at the camera pupil formed by the radiation from the six mirror segments of FIG. 13A;

FIG. 14A illustrates the six mirror segments of the collector mirror with four segments that are partially covered with vignetting masks; and FIG. 14B illustrates the intensity profile at the camera pupil formed by the radiation from the six mirror segments of FIG. 14A.

DETAILED DESCRIPTION OF THE INVENTION

The following terms of art are defined before providing a description and discussion of the present invention.

A. Terms of Art

Synchrotron Source: X-ray radiation source constructed from a storage ring providing for relativistic electrons or positrons confined by magnetic fields to a repeating orbital path.

A small, compact source of radiation: A volume that radiates extreme-UV radiation. An example of such a source is a laser-generated plasma. "Small" implies a radiating volume with dimensions in the three principle directions smaller than about 0.2 mm. "Compact" implies that the three dimensions are roughly the same, differing from one-another by less than a factor of two. These lengths are defined as the full width between the half-maximum intensity points.

Illuminating Radiation: A collection of photons, each of which has energy capable of exposing photoresist incident on and producing an illumination field on a mask. The illumination field is characterized by its intensity, direction, divergence, and spectral width.

EUV: Extreme Ultra-Violet Radiation, also known as soft x-rays, with wavelength in the range of 50 to 700 Å.

Ringfield Camera: While the inventive condenser is not limited to use with any particular ringfield camera, a preferred one is described in Sweeney et al., "EUV Optical Design for a 100 nm CD Imaging System" SPIE Vol. 3331, pages 2–10, 1998, which is incorporated herein by reference.

Partial Coherence: Partial coherence as applied to lithographic systems refers to the illumination pattern in the camera's pupil. A disk of light centered in the pupil is the norm, and the radius of this disk is typically about 70% as large as the pupil. This ratio of radii is commonly defined as the sigma factor. Another known illumination pattern used in lithography is annular illumination, where the light is substantially ring-shaped and centered in the pupil. The process latitude for printing a particular image can usually be increased if one can choose the optimum partial coherence. A larger process latitude implies steeper sidewalls in the aerial image. Thus, if there is a small error in the dose (integrated light flux at the wafer) or in the processing, the critical dimensions (CD) in the printed image vary only slightly. Thus, permitting the lithographers to vary the partial coherence of the illumination frequently results in a better yield.

Spherical Mirror: A mirror, either concave or convex, whose surface forms part of a sphere. Although the present invention employs the use of spherical mirrors for convenience and economical concerns, it is intended that other mirrors be covered by the present invention, such as toroidal, and conic section (e.g., parabolic, hyperbolic, general aspheric, elliptical, cylindrical, etc.), mirrors that may be substituted for spherical mirrors within tolerable industry standards (including those with minor flaws or aberrations), etc.

Flat Mirror: A mirror whose surface is nearly flat within manufacturing tolerances. Although the present invention employs the use of flat mirrors, it is intended that the present invention be easily modified by those of ordinary skill in the art to employ the use of other shaped mirrors where flat mirrors are disclosed in the following discussion.

Divergence: As used by itself, the term refers to a cone of rays diverging from an object or image point.

Convergence: As used by itself, the term refers to a cone of light converging toward an image point, a.k.a. focusing.

Condenser: Optical system for collecting the source radiation, for processing the source radiation to produce a ringfield illumination field and for illuminating the mask.

Collecting Optics (or Collector): The optics within the condenser responsible for collecting the source radiation. The collector has a focus.

Processing Optics: The optics within the condenser that is responsible for orienting and positioning the collected beams, and modifying their convergence.

Imaging Optics (or Camera Optics): The optics following the condenser and mask, in addition to the collecting and processing optics, responsible for delivering mask-modulated radiation to the wafer, i.e., the camera optics.

Camera Pupil: Real or virtual aperture that defines an opening through which source radiation from any object point must enter the camera. Its physical size is that of an image of the real limiting aperture of the camera.

Sigma ($\sigma$) factor: Proportion of the camera pupil that is filled. Specifically, it is calculated as the ratio of the radius of the disk of illumination at the camera pupil to the radius of the camera pupil.

Aperture Stop: The point at which the principal rays cross; the stop serves to limit the size of the cone angles of the ray bundles converging toward the image from any point in the object field.

Lens: The term is used in this description to define any optical element which causes radiation to converge or diverge. "Lenses," in soft x-ray or EUV systems, are generally reflecting and are sometimes referred to as "mirrors." Contemplated lenses may be multi-faceted or may be non-faceted, i.e., continuous, e.g., of ellipsoidal or other curvature. The convergence or divergence is a result of action analogous to that of a transmission optical lens.

Full-field Exposure: Simultaneous (rather than sequential) exposure of all subareas of an image field. In its derivation, the term refers generally to a complete circuit pattern such as that of an entire chip. In this description, it is used to refer to any low-aspect ratio rectilinear pattern region, whether of an entire or partial pattern. Contemplated partial patterns may be stitched together by step-and-repeat to constitute the entire pattern.

Vignetting or trimming: Generally, refers to attenuating or blocking radiation (e.g, EUV), for instance, from reaching mirrors. As an example, vignetting can be employed to change the intensity profile at the camera's entrance pupil.

Vignetting mask: Radiation (e.g., EUV) absorbing and/or reflecting shield that is positioned in the path of radiation to at least partially block the radiation to modify the cross-sectional area of the beam.

B. The Invention

The overall layout of the EUV lithography system is shown in FIG. 1A. The radiation is collected from the source 22 by mirror segments 30 (referred to collectively as the "$C_1$" mirrors) which create arc images that are in turn are rotated by roof mirror pairs illustrated collectively as mirrors 40 and 50 (referred herein as the "$C_2$" and "$C_3$" mirrors, respectively). Beams of radiation reflected from mirrors 50 are reflected by a toric mirror 60 (or $C_4$ mirror) to deliver six overlapped ringfield segments onto reflective mask 70. At least two segments of the parent mirror 30 are employed. Typically, the parent mirror is partitioned into 2 to 12 segments, preferably into 5 to 8 segments, and most preferably into 6 segments as shown. As an example, mirror 31 creates an arc image and roof mirror pair 41 and 51 rotates the arc image to fit the slit image and translate it to the proper position. Similar arc images are created and processed by mirror combinations 32, 42, and 52, and so on. Mirrors 41, 42, and 43 are parts of different and unique channels; and the group of mirrors 44, 45, and 46 is a mirror image of the group of mirrors 41, 42, and 43, respectively.

The distance from the $C_3$ mirrors defining the condenser's pupil to the $C_4$ mirror should be 3 to 10 times as long as the distance from the $C_4$ mirror to mask 70. An illustrative arc 71 is shown on mask 70.

The EUV lithography system further includes a ringfield camera 77 having a set of mirrors which images the mask using the radiation onto wafer 78. As is apparent, the $C_4$ mirror follows the real entrance pupil.

Each of the six pairs of $C_2$ and $C_3$ mirrors act as a roof-mirror pair that rotate and translate the 6 channels so that they overlap. Specifically, the $C_2$ and $C_3$ mirror pairs rotate the arcuate images produced by the $C_1$ mirrors so that they can be superimposed at the mask plane. The $C_2$ mirrors are preferably flat and are used at grazing incidence, which is preferably 82 degrees angle of incidence for the chief ray. The chief ray angle of incidence is preferably constrained to have the same angle of incidence at each $C_2$ mirror so that the reflectivities will be the same. Further, the $C_1$ angles are preferably tilted about the source to allow the angles of incidence to be the same at $C_1$. The $C_3$ mirrors typically have weak convex spherical surfaces which relay the $C_1$ arcuate images onto the mask. The $C_3$ mirrors are located at the system pupil (i.e., where the azimuthal beam cross-section is a minimum) to facilitate packaging and are tilted to overlay the arcuate images from the six channels. The $C_3$ mirrors are preferably positioned as close together as possible (approximately 3 mm separates the clear apertures) to maximize the amount of EUV that can be directed into the camera.

FIGS. 1B and 1C depict the $C_4$ field mirror 60 which is toroidally (or elliptically) shaped. As shown, a beam cross section 62 from the condenser is reflected from the surface of the mirror 60 to form a curved slit illumination 71 on moving mask 70. Beam 75 is propagated from the mask into the camera. The toroid images the real pupil containing the $C_3$ mirrors into the entrance pupil of the camera. The focal length of mirror $C_4$ can be determined from the lens maker's equation. The radii of curvature $R_x$ and $R_y$ are functions of the focal length and the angle of incidence $\theta$, as determined by Coddington's equation. The tilt angle also tends to distort the cross-section of an incident beam, with the distortion increasing with angle of incidence. The source of this distortion is shown in FIG. 1C. Specifically, FIG. 1C illustrates an embodiment of the $C_4$ biconcave mirror where $R_y$ is 0.6 m and $R_x$ is 9.0 m. As is apparent, remapping occurs when the middle of the 50 degrees segment is reflected off the bottom of the nearly cylindrical, steeply tilted concave mirror while the ends reflect off the edges of the mirror which are higher.

FIGS. 2A and 2B shows a beam segment before and after reshaping. Note that the ends of the 50 degrees segment curl far more than those of the 28 degrees segment.

Condensers of the present invention are particularly suited for use in projection lithography for fabricating integrated devices that comprise at least one element having a dimension of $\leq 0.25$ μm and preferably $\leq 0.18$ μm. The process comprises construction of a plurality of successive levels by lithographic delineation using a mask pattern that is illuminated to produce a corresponding pattern image on the device being fabricated, ultimately to result in removal of or addition of material in the pattern image regions. Typically, where lithographic delineation is by projection, the collected radiation is processed to accommodate imaging optics of a projection camera and image quality that is substantially equal in the scan and cross-scan directions, and smoothly varying as the space between adjacent lines varies. In a preferred embodiment, projection comprises ringfield scanning comprising illumination of a straight or arcuate region of a projection mask. In another preferred embodiment, projection comprises reduction ringfield scanning in which an imaged arcuate region on the image plane is of reduced size relative to that of the subject arcuate region so that the imaged pattern is reduced in size relative to the mask region.

As shown in FIG. 3, the illuminator or collecting mirrors are composed of six off-axis segments of an aspheric mirror, each 50 degrees wide, producing six beams which each cross over the system axis or centerline 11 as defined by the source and the center of the parent mirror. The parent aspheric mirror 10 images the "point" source 12 into a ring image 14. Therefore, its cross-section in the r-z plane is elliptical with one of the foci at the plasma source and the other at the ringfield radius. Each of the 50 degree mirror segments images the source into a 50 degree segment of the ring image.

FIG. 4 shows both a meridian cross-sectional view and an isometric view of the beam from one segment 20 of the aspheric mirror, with the isometric view rotated relative to the side view about a line 25 passing through the area of the beam having a smallest beam cross section. It shows the shape of the collector mirror 20, the arc image 22, and the bow-tie-shaped minimum beam cross-section 24, which is located at the center of the axial line focus. This design gives uniform illumination along the length of the arc 22.

Each segment of the $C_1$ mirror is astigmatic, having different circumferential and tangential focal planes. The circumferential image is the on-axis line focus 13 shown in FIG. 4. This line is centered in the real entrance pupil, essentially giving Kohler illumination along the ring field. The tangential image 22 (in the r-z plane) is located at the ring field, giving critical illumination. In a normal, non-scanning system this would give intensity and image quality variations in the radial direction. However, the scanning integrates out these radial variations. Hence, one is left with the uniform image quality which can only be achieved with two-dimensional Kohler illumination in a non-scanned system.

Partial coherence in the illumination affects the image quality. In an incoherently illuminated optical system, small features are attenuated due to the fall-off of the modulation transfer function (MTF). Partial conherence can be introduced into the illumination to counter this attenuation. This normally is done by underfilling the entrance pupil in a system with Kohler illumination. Put a different way, the source (which is usually a disk) is imaged into the entrance pupil, and this image is smaller than the pupil by a factor of $\sigma \cong 0.6$. This value of $\sigma$ is a reasonable compromise which amplifies the small features and does not add too much "ringing" to the larger features.

Another preferred system employs a laser plasma source that emits soft x-rays where the diameter and height of the source is about 150 μm. The camera at the other end of the system images a 28 degree, 100 mm long by 4 mm wide ringfield onto the wafer at 4× reduction. The entrance pupil is 3 m behind the reflective object mask, and the numerical aperture of the camera is n.a.=0.10 at the wafer and 0.025 at the mask.

The $C_4$ mirror images the real entrance pupil (the $C_3$ plane) into the camera's entrance pupil. The size of this image should not vary significantly from that chosen to give the correct partial coherence (i.e. $\sigma$=0.7). Because the fuzziness of the image is relatively unimportant, a simple toroid can be used to reimage the pupil.

Mirror sets 40 and 50 act as a roof-mirror pairs that rotate the arcs in the 6 channels so they overlap. As an example, mirror 31 creates an arc image and roof mirror pair 41 and 51 rotates the arc image to fit the slit image. Similar arc images are created and rotated by mirror combinations 32, 42, and 52, and so on. Mirrors 41, 42, and 43 are parts of different and unique channels; and mirrors 44, 45, and 46 are mirror images of mirrors 41, 42, and 43, respectively.

FIGS. 5A, 5B, and 5C illustrate how vignetting at the $C_1$ mirror array affects the intensity the slit image. FIG. 5A illustrates the six segments 81, 82, 83, 84, 85, and 86 of the of the $C_1$ mirror and FIG. 5B illustrates the intensity profile at the camera pupil of the photolithography system is shown in FIG. 1A. It comprises six bow tie beam cross-sections (131, 132, 133, 134, 135, and 136) arranged in a circle. The bow tie beam cross-sections each has an upper and a lower half or loop. The bow tie beam cross-sections are generated by reflection of EUV radiation from the six mirror segments 81–86 of the $C_1$ mirror and channeling therefrom. FIG. 5C is a sketch of the arc-shaped slit 160 with several regions that are highlighted.

Referring to segment 86 of the $C_1$ mirror, the edge 86A and all of the other forward clock-wise edges of the $C_1$ mirror segments are imaged at the left end 161 of slit 160. All of the dotted lines shown in FIG. 5A (e.g, 86C) and to the right are imaged at positioned 163 of slit 160. Finally, edge 86B is imaged at the right end 162 of slit 160 while edge 86A is imaged at the left end 161 of slit 160.

As shown in FIG. 5A, parts of $C_1$ mirror segments 82, 84, 85, and 86 designated 82D and 82E, 84E, 85D and 85E, and 86D and 86E, respectively, are vignetted. FIG. 5B shows the effect this has on the intensity profile at the camera pupil. The effect of this vignetting configuration is to reduce the flux to area 163 of slit 160 as shown in FIG. 5C. It should be noted that the locations of the trimming on the mirror segments are illustrative, the actual positions may be different and will depend on the desired goals, for example, changing the partial coherence, modifying the illumination uniform over the length of the slit and moving the weighted centroid of the beam in the pupil.

Finally, the vignetting mask can also be employed to "cool down" one or more beams whose intensity is higher than the others. As illustrated in FIG. 5A, if the beam that forms bow tie 131 at the entrance pupil is brighter than the other beams, for example, its brightness can be reduced by making the intensity pattern in the entrance pupil more symmetrical, i.e, the position of the centroid of the optical power or flux is restored to the center of the beam pattern. Specifically, vignetting masks 131A and/or 131B can be employed at any suitable position typically at the $C_1$ or $C_3$ mirrors or at positions in between to trim sufficient power in the beam. Preferably one or more small vignetting masks are positioned at the appropriate $C_3$ mirror array because the beam lines can be vignetted at this position without changing its apparent length or affecting its symmetry.

Trimming Collection Mirror Segments to Remove Intensity "Bump" Measured in Ring Image Arc As shown in FIG. 1A, the condenser produces several, e.g., six, equal arcs that are then superimposed on each other at the ringfield radius. The imaging optics in turn converge the arc-shaped light beams and transmit them to a reflective mask or reticle 70 and into the virtual entrance pupil of the camera and illuminating the ringfield of the camera. Unfortunately, the illumination on the reticle 70 may not be uniform. For example, the intensity of illumination at the center of the arc-shaped illumination (or slit) 71 is higher than that at the ends.

FIG. 6 is a representative graph of the intensity of the arc-shaped illumination (or slit) along the length of the slit. As is apparent, the intensity is not uniform along the length and in this particular example, there is a "bump" in the intensity. One approach to solving this problem is to adjust or trim the aperture of the $C_1$ mirror. FIG. 7A illustrates the six segments 81, 82, 83, 84, 85, and 86 of the $C_1$ mirror and FIG. 7B illustrates the intensity profile at the camera pupil of the photolithography system is shown in FIG. 1A. It comprises six bow tie beam cross-sections (131, 132, 133, 134, 135, and 136) arranged in a circle. The bow tie beam cross-sections each has an upper and a lower half or loop. The bow tie beam cross-sections are generated by reflection of EUV radiation from the six mirror segments 81–86 of the $C_1$ mirror and channeling therefrom.

In this example, in order to remove the "bump" in the intensity profile shown in FIG. 6, the intensity of 4 of the bow ties in FIG. 7B is reduced at locations 92, 93, 95, and 96 on bow ties 132, 133, 135 and 136, respectively. The corresponding locations on the $C_1$ mirrors 82, 83, 85 and 86, where trimming needs to occur are designated 102, 103, 105 and 106, respectively.

A preferred method of attenuating or blocking the inner part of the six segment array is to at least partially cover one or more of the appropriate segment(s) of the $C_1$ mirror 30. FIG. 8 shows the six segments 181, 182, 183, 184, 185, and 186 of the $C_1$ mirrors which are encased in protective shroud 90. As shown in FIG. 1A, the segments are positioned in front of EUV radiation source 22. As illustrated, segments 182, 183, 185, and 186 are partially covered by shields 182A, 183A, 185A, and 186A respectively. The shields or vignetting masks serve to block some of the EUV radiation from the source from reaching the segments and being reflected therefrom and/or they may serve to block some of the EUV radiation departing the segment. Because each segment profile map directly into the arc-shaped illumination, the shields so positioned will enhance uniformity by reducing the intensity in the end of the arc-shaped illumination. The shield is fabricated from any suitable EUV radiation absorbing material, e.g., aluminum.

By partially shielding the $C_1$ mirror segments, a more uniform intensity of illumination on the reticle is achieved. With this technique, it is expected that the illumination at the ends of the arc-shaped illumination 71 will preferably be from about 99% to 101% of the illumination of the center. It is expected that by enhancing illumination uniformity at the reticle, the illumination at the wafer will be ultimately enhanced as well.

Trimming $C_3$ Mirror Array at the Real Entrance Pupil

Alternatively, instead of shielding the $C_1$ mirror array, shields at the $C_3$ mirror array can be employed to enhance intensity uniformity and/or reduce the intensity. Specifically, the technique involves adjusting the amount of EUV radiation before it reaches the $C_3$ mirror array 50 shown in FIG. 1A. FIG. 9 illustrates the six bow tie 151, 152, 153, 154, 155 and 156 illumination patterns on mirror segments 161, 162, 163, 164, 165, and 166, respectively of the $C_3$ mirror array 50. One or more of the segments can have associated shield(s) or vignetting mask(s) to partially block some of the EUV radiation that is directed to a particular mirror. Specifically, as shown in FIG. 9 shields 172 and 173 each covers lower portions of mirrors 152 and 153, respectively, and shields 175 and 176 to cover the upper portions of 155 and 156, respectively. These shields effectively block part of the bow tie array so that the illumination at the inner part of the array is attenuated or blocked before reaching the $C_3$ mirror array. As is apparent, the size and shape of the vignetting masks shown are illustrative only; vignetting masks can be configured to achieve the level of illumination intensity desired.

As is apparent, FIG. 9 depicts a method to generate a substantially annular illumination by trimming the appropriate parts of the beams at the $C_3$ mirror array.

Illumination Shield Positioned at the Mask or Wafer

A method of producing a more elongated illumination pattern and less of an arc on the reticle or wafer is to position a metal plate or barrier to block off some of the EUV radiation before reaching the reticle or wafer. FIG. 10 illustrates such an illumination shield that comprises plate 200 with window 210 that is dimensioned so that some of the EUV radiation in the form of arc-shaped slit 220 is absorbed by the plate and the portion that passes through the window defines the desired illumination pattern. The window, which is at least partially transparent to the illumination radiation (e.g., EUV), may comprise an opening or be made of an EUV radiation transmitting material such as beryllium, for example. The plate can be positioned in front of reticle 70 and/or in front of wafer 78 shown in FIG. 1A.

Smoothly Trimming Intensity Along Ring Image Arc

As described above, partially shielding the collection $C_1$ mirror segments removes perturbations or "bumps", but the technique can be used generally to reduce illumination intensity variations of the arc-shaped illumination (or slit) at the mask and correspondingly at the wafer. One method is to employ vignetting masks to at least partially block the lower edges of bow ties 132 and 133 and the upper edges of bow ties 135 and 136 of the intensity profile of the camera's entrance pupil as shown in FIG. 7B. The effect is that the intensity of illumination of the slit will be more uniform along its length.

FIG. 11 is a representative graph of the average intensity along the length of the slit. As is apparent, the intensity is lower at the ends of the slit. One approach to solving this problem is to adjust or trim the aperture of the $C_1$ mirror. FIG. 12A illustrates the six segments 81, 82, 83, 84, 85, and 86 of the of the $C_1$ mirror and FIG. 12B illustrates the intensity profile at the camera pupil of the photolithography system is shown in FIG. 1A. In this example, in order to make the intensity profile uniform, the intensity of 4 of the bow ties as shown in FIG. 12B is reduced at the interior regions of the camera pupil. The corresponding locations 172, 173, 175 and 176 on the $C_1$ mirrors where trimming needs to occur (e.g., by vignetting masks) are shown. The result is that the intensity profile of the slit is uniform with a small loss in overall intensity. Thus the power is equalized along the slit with the vignetting. To reduce the overall power, the exposure time can be reduced, the intensity of the source of radiation can be lower, and the like.

If the beams were all trimmed on the outer edge of the $C_1$ mirror segments, then the centroid of the array in the camera pupil would move upward which is not desired. Beam trimming that removes power from the center of the array has very little effect on the camera's imaging properties. Trimming the other ends of the bow ties would make the partial coherence vary over the length of the field.

Creating Annular Illumination

Annular illumination is desirable for printing some types of patterns. This can be created by vignetting the center of the pattern in the entrance pupil and moving the side beams outward slightly (e.g., by repainting them). FIG. 13A illustrates the trimming locations 142, 143, 145 and 146 of the $C_1$ mirror segments 82, 83, 85, and 86, respectively; and FIG. 13B shows the annular illumination that is created at the camera pupil.

Changing Sigma in the Camera Pupil Fill

Another aspect of employing the shields at either the $C_1$ or $C_3$ mirrors described above is that the partial coherence of the EUVL system can be adjusted by controlling the sigma ($\delta$) factor. FIG. 14B depicts the illumination of the entrance pupil where the sigma has been reduced from 0.7 to 0.6. Specifically, portions most of the bow ties at the ends near the outside of the pattern are eliminated so as to reduce the pupil fill.

One method to change to the sigma factor is to employ the shields over the $C_1$ or $C_3$ mirrors. FIG. 14A illustrates a shield pattern for the six $C_1$ mirror segments to achieve the illumination pattern shown in FIG. 14B. As shown, trimming locations 111A and 111B are on the two ends of mirror 81; trimming locations 112A and 113A are on the outer edges of mirrors 82 and 83, respectively; trimming locations 114A and 114B are on the two ends of mirrors 84; and trimming locations 115B and 116B are on the outer edges of mirrors 85 and 86, respectively.

To achieve the same results using shields at the $C_3$ mirrors, shields similar to those illustrated in FIG. 9 can be employed the over the $C_3$ mirrors to block the appropriate portions represented by dash lines of the mirror that correspond to the outer portions of the bow ties shown in FIG. 14B.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A photolithography system for projecting a mask image onto a wafer that comprises:
    a ringfield camera;
    a small compact source of radiation;
    a condenser to collect and image radiation to a mask that comprises:
        (i) collector mirrors comprising at least two substantially equal radial segments of a parent aspheric mirror, each having one focus at the radiation source and a curved line focus filling the object field of the camera at the radius of the ringfield and each producing a beam of radiation; and
        (ii) corresponding number of sets of correcting mirror means which are capable of translation or rotation, or both, such that all of the beams of radiation pass through the entrance pupil of the ringfield camera and form a coincident arc image at the ringfield radius, wherein at least one of the correcting mirrors of each set, or a mirror that is common to said sets of mirrors, from which the radiation emanates, is a concave relay mirror that is positioned to shape a beam segment having a chord angle of about 25 to 85 degrees into a second beam segment having a chord angle of about 0 to 60 degrees;
    a mask that is positioned at the ringfield camera's object plane and from which the mask image in the form of an intensity profile is reflected into the entrance pupil of the ringfield camera wherein the distance from the collector mirrors to the concave relay mirror is equal to 3 to 10 times the distance from the concave relay mirror to the mask;
    a wafer onto which the mask image is projected from the ringfield camera; and
    means for adjusting the intensity profile at the camera's entrance pupil.

2. The photolithography system of claim 1 wherein the intensity profile is formed by an illumination flux that defines a centroid position and wherein the adjusting means changes at least one of: (i) partial coherence of the photolithography system, (ii) mask image illumination uniformity on the wafer or (iii) centroid position of the illumination flux in the entrance pupil.

3. The photolithography system of claim 1 wherein the adjusting means comprises at least one vignetting mask that covers at least a portion of the at least two substantially equal radial segments of the parent aspheric mirror.

4. The photolithography system of claim 3 wherein the adjusting means changes the partial coherence by reducing the area of the entrance pupil that is filled by the image.

5. The photolithography system of claim 3 wherein the intensity profile is formed by an illumination flux that defines a centroid position and wherein the adjusting means adjusts at least one of the (ii) mask image illumination uniformity on the wafer or (iii) centroid position of the illumination flux in the entrance pupil.

6. The photolithography system of claim 1 wherein the adjusting means produces a substantially annular intensity profile at the camera's entrance profile.

7. The photolithography system of claim 1 wherein the correcting mirrors comprise one or more reflection mirrors that are positioned at an image of the photolithography system's pupil and the adjusting means comprises one or more vignetting masks that covers at least a portion of the one or more reflection mirrors so that part of the beam of radiation from the collector mirrors is blocked by the vignetting masks before reaching the reflection mirrors.

8. The photolithography system of claim 1 wherein the correcting mirrors comprise one or more reflection mirrors that are positioned at an image of the photolithography system's pupil and the adjusting means comprises one or more vignetting masks that are positioned so that a portion of the radiation reflected from the one or more reflection mirrors is blocked by vignetting masks.

9. The photolithography system of claim 7 wherein the adjusting means changes the partial coherence by reducing the area of the entrance pupil that is filled by the image.

10. The photolithography system of claim 8 wherein the adjusting means changes the partial coherence by reducing the area of the entrance pupil that is filled by the image.

11. The photolithography system of claim 7 wherein the intensity profile is formed by an illumination flux that defines a centroid position and wherein the adjusting means adjusts at least one of the (ii) mask image illumination uniformity on the wafer or (iii) centroid position of the illumination flux in the entrance pupil.

12. The photolithography system of claim 8 wherein the intensity profile is formed by an illumination flux that defines a centroid position and wherein the adjusting means adjusts at least one of the (ii) mask image illumination uniformity on the wafer or (iii) centroid position of the illumination flux in the entrance pupil.

13. The photolithography system of claim 1 wherein the said collector mirrors comprise six substantially equal radial segments of a parent aspheric mirror.

14. A photolithography system for projecting a mask image onto a wafer that comprises:
a ringfield camera;
a small compact source of radiation;
a condenser to collect and image radiation to a mask that comprises:
  (i) collector mirrors comprising at least two substantially equal radial segments of a parent aspheric mirror, each having one focus at the radiation source and a curved line focus filling the object field of the camera at the radius of the ringfield and each producing a beam of radiation; and
  (ii) corresponding number of sets of correcting mirror means which are capable of translation or rotation, or both, such that all of the beams of radiation pass through the entrance pupil of the ringfield camera and form a coincident arc image at the ringfield radius, wherein at least one of the correcting mirrors of each set, or a mirror that is common to said sets of mirrors, from which the radiation emanates, is a concave relay mirror that is positioned to shape a beam segment having a chord angle of about 25 to 85 degrees into a second beam segment having a chord angle of about 0 to 60 degrees;
a mask that is positioned at the ringfield camera's object plane and from which the mask image in the form of an intensity profile is reflected into the entrance pupil of the ringfield camera wherein the distance from the collector mirrors to the concave relay mirror is equal to 3 to 10 times the distance from the concave relay mirror to the mask;
a wafer onto which the mask image is projected from the ringfield camera; and
an illumination shield having a window through which radiation is transmitted,
wherein the illumination shield is positioned adjacent the mask or the wafer.

15. The photolithography system of claim 14 wherein the illumination shield defines a region that is at least partially transparent to extreme ultra-violet radiation wherein the shield covers the mask.

16. The photolithography system of claim 14 wherein the illumination shield defines a region that is at least partially transparent to extreme ultra-violet radiation wherein the shield covers the wafer.

17. A process for fabrication of a device on a wafer comprising at least one element having a dimension $\leq 0.25$ $\mu$m, such process comprising construction of a plurality of successive levels, construction of each level comprising lithographic delineation, in accordance with which a subject mask pattern on a mask is illuminated to produce a corresponding pattern image on the device being fabricated, ultimately to result in removal of or addition of material in the pattern image regions, in which illumination used in fabrication of at least one level is extreme ultra-violet radiation, characterized in that the process employs a photolithography system for projecting an image onto the wafer wherein the
photolithography system comprising:
  (a) a ringfield camera; (b) a small compact source of radiation; (c) a condenser that comprises:
    (i) collector mirrors comprising at least two substantially equal radial segments of a parent aspheric mirror, each having one focus at the radiation source and a curved line focus filling the object field of the camera at the radius of the ringfield and each producing a beam of radiation; and
    (ii) corresponding number of sets of correcting mirror means which are capable of translation or rotation, or both, such that all of the beams of radiation pass through the entrance pupil of the ringfield camera and form a coincident arc image at the ringfield radius, wherein at least one of the correcting mirrors of each set, or a mirror that is common to said sets of mirrors, from which the radiation emanates, is a concave relay mirror that is positioned to shape a beam segment having a chord angle of about 25 to 85 degrees into a second beam segment having a chord angle of about 0 to 60 degrees; and
  (d) a mask that is positioned at the ringfield camera's virtual entrance pupil and onto which an illumination image is focused and from which a mask image in the form of an intensity profile is reflected into the entrance pupil of the ringfield camera wherein the distance from the collector mirrors to the concave relay mirror is equal to 3 to 10 times the distance from the concave relay mirror to the mask; and
  (e) a wafer onto which the mask image is projected from the ringfield camera;
wherein the process comprises the step of employing means to adjust the intensity profile at the camera's entrance pupil.

18. The process of claim 17 wherein the intensity profile is formed by an illumination flux that defines a centroid position and wherein the adjusting means changes at least one of: (i) partial coherence of the photolithography system, (ii) mask image illumination uniformity on the wafer or (iii) centroid position of the illumination flux in the entrance pupil.

19. The process of claim 17 wherein the adjusting means comprises at least one vignetting mask that covers at least a portion of the at least two substantially equal radial segments of the parent aspheric mirror.

20. The process of claim 19 wherein the adjusting means changes the partial coherence by reducing the area of the entrance pupil that is filled by the image.

21. The process of claim 19 wherein the intensity profile is formed by an illumination flux that defines a centroid position and wherein the adjusting means adjusts at least one of the (ii) mask image illumination uniformity on the wafer or (iii) centroid position of the illumination flux in the entrance pupil.

22. The process of claim 17 wherein the adjusting means produces a substantially annular intensity profile at the camera's entrance profile.

23. The process of claim 17 wherein the correcting mirrors comprise one or more reflection mirrors that are positioned at an image of the photolithography system's pupil and the adjusting means comprises one or more vignetting masks that covers at least a portion of the one or more reflection mirrors so that part of the beam of radiation from the collector mirrors is blocked by the vignetting masks before reaching the reflection mirrors.

24. The process of claim 17 wherein the correcting mirrors comprise one or more reflection mirrors that are positioned at an image of the photolithography system's pupil and the adjusting means comprises one or more vignetting masks that are positioned so that a portion of the radiation reflected from the one or more reflection mirrors is blocked by vignetting masks.

25. The process of claim 23 wherein the adjusting means changes the partial coherence by reducing the area of the entrance pupil that is filled by the image.

26. The process of claim 24 wherein the adjusting means changes the partial coherence by reducing the area of the entrance pupil that is filled by the image.

27. The process of claim 23 wherein the intensity profile is formed by an illumination flux that defines a centroid position and wherein the adjusting means adjusts at least one of the (ii) mask image illumination uniformity on the wafer or (iii) centroid position of the illumination flux in the entrance pupil.

28. The process of claim 24 wherein the intensity profile is formed by an illumination flux that defines a centroid position and wherein the adjusting means adjusts at least one of the (ii) mask image illumination uniformity on the wafer or (iii) centroid position of the illumination flux in the entrance pupil.

29. The process of claim 17 wherein the said collector mirrors comprise six substantially equal radial segments of a parent aspheric mirror.

30. A process for fabrication of a device on a wafer comprising at least one element having a dimension $\leq 0.25$ $\mu$m, such process comprising construction of a plurality of successive levels, construction of each level comprising lithographic delineation, in accordance with which a subject mask pattern on a mask is illuminated to produce a corresponding pattern image on the device being fabricated, ultimately to result in removal of or addition of material in the pattern image regions, in which illumination used in fabrication of at least one level is extreme ultra-violet radiation, characterized in that the process employs a photolithography system for projecting an image onto the wafer wherein the photolithography system comprising:

(a) a ringfield camera; (b) a small compact source of radiation; (c) a condenser that comprises:
  (i) collector mirrors comprising at least two substantially equal radial segments of a parent aspheric mirror, each having one focus at the radiation source and a curved line focus filling the object field of the camera at the radius of the ringfield and each producing a beam of radiation; and
  (ii) corresponding number of sets of correcting mirror means which are capable of translation or rotation, or both, such that all of the beams of radiation pass through the entrance pupil of the ringfield camera and form a coincident arc image at the ringfield radius, wherein at least one of the correcting mirrors of each set, or a mirror that is common to said sets of mirrors, from which the radiation emanates, is a concave relay mirror that is positioned to shape a beam segment having a chord angle of about 25 to 85 degrees into a second beam segment having a chord angle of about 0 to 60 degrees; and (d) a mask that is positioned at the ringfield camera's virtual entrance pupil and onto which an illumination image is focused and from which a mask image in the form of an intensity profile is reflected into the entrance pupil of the ringfield camera wherein the distance from the collector mirrors to the concave relay mirror is equal to 3 to 10 times the distance from the concave relay mirror to the mask; and (e) a wafer onto which the mask image is projected from the ringfield camera;

wherein the process comprises the step of positioning an illumination shield, having a window through which radiation is transmitted, adjacent the mask or wafer.

31. The process of claim 30 wherein the illumination shield defines a region that is at least partially transparent to extreme ultra-violet radiation wherein the shield covers the mask.

32. The process of claim 30 wherein the illumination shield defines a region that is at least partially transparent to extreme ultra-violet radiation wherein the shield covers the wafer.

* * * * *